(12) United States Patent
Tsvetkov et al.

(10) Patent No.: US 6,964,917 B2
(45) Date of Patent: Nov. 15, 2005

(54) SEMI-INSULATING SILICON CARBIDE PRODUCED BY NEUTRON TRANSMUTATION DOPING

(75) Inventors: Valeri F. Tsvetkov, Durham, NC (US); Hudson M. Hobgood, Pittsboro, NC (US); Calvin H. Carter, Jr., Durham, NC (US); Jason R. Jenny, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/249,425

(22) Filed: Apr. 8, 2003

(65) Prior Publication Data

US 2004/0201024 A1 Oct. 14, 2004

(51) Int. Cl.$^7$ .................. H01L 21/261; H01L 21/425; H01L 21/265
(52) U.S. Cl. .................. 438/512; 438/516; 438/522; 438/931
(58) Field of Search .................. 438/516–518, 438/512, 105, 931, 522; 257/77, 610, 609, 612

(56) References Cited

U.S. PATENT DOCUMENTS

| | | |
|---|---|---|
| 4,260,448 A | 4/1981 | Herzer |
| 4,469,527 A | 9/1984 | Sugano et al. |
| 4,479,829 A | 10/1984 | Kniepkamp |
| 4,866,005 A | 9/1989 | Davis et al. |
| 4,910,156 A | 3/1990 | Takasu et al. |
| 4,912,064 A | 3/1990 | Kong et al. |
| 5,119,540 A | 6/1992 | Kong et al. |
| RE34,861 E | 2/1995 | Davis et al. |
| 5,611,955 A | 3/1997 | Barrett et al. |
| 6,063,186 A | 5/2000 | Irvine et al. |
| 6,218,680 B1 | 4/2001 | Carter, Jr. et al. |
| 6,297,522 B1 | 10/2001 | Kordina et al. |
| 6,396,080 B2 | 5/2002 | Carter, Jr. et al. |
| 6,403,982 B2 | 6/2002 | Carter, Jr. et al. |
| 6,507,046 B2 * | 1/2003 | Mueller ................ 257/77 |
| 2001/0017374 A1 | 8/2001 | Carter, Jr. et al. |
| 2001/0019132 A1 | 9/2001 | Carter, Jr. et al. |
| 2001/0023945 A1 | 9/2001 | Carter, Jr. et al. |
| 2002/0076890 A1 * | 6/2002 | Casady et al. ........... 438/312 |
| 2002/0167010 A1 | 11/2002 | Mueller |

FOREIGN PATENT DOCUMENTS

WO WO 01/06557 A1 1/2001

OTHER PUBLICATIONS

Hans Heissenstein et al.; Radiation Defects and Doping of SiC with Phosphorus by Nuclear Transmutation Doping (NTD); Materials Science Forum; pp. 853–856; vols. 338–342 (2000); Trans Tech Publications, Switzerland.

Hans Heissenstein et al.; Characterization of phosphorus doped n–type 6 H–silicon carbide epitaxial layers produced by nuclear transmutation doping; Journal of Applied Physics: Jun. 15, 1998; pp. 7542–7546; vol. 83, No. 12; American Institute of Physics.

Phosphorous Doped Silicon by Neutron Radiation; www.siliconwafers.net/ntd–silicon.htm; 1 page.

* cited by examiner

*Primary Examiner*—Shouxiang Hu
(74) *Attorney, Agent, or Firm*—Summa & Allan, P.A.

(57) ABSTRACT

A method is disclosed for producing highly uniform semi-insulating characteristics in single crystal silicon carbide for semiconductor applications. The method includes irradiating a silicon carbide single crystal having net p-type doping and deep levels with neutrons until the concentration of $^{31}$P equals or exceeds the original net p-type doping while remaining equal to or less than the sum of the concentration of deep levels and the original net p-type doping.

31 Claims, No Drawings

SEMI-INSULATING SILICON CARBIDE PRODUCED BY NEUTRON TRANSMUTATION DOPING

BACKGROUND OF INVENTION

The present invention relates to the growth of high quality silicon carbide crystals for specific purposes, and in particular relates to the production of high quality semi-insulating silicon carbide substrates that are useful in microwave devices.

The subject matter of the invention is related to the subject matter of commonly-assigned U.S. Pat. No. 6,218,680 and its progeny, U.S. Pat. Nos. 6,396,080 and 6,403,982; and also to Publication No. US 20020167010; the contents of each of which are incorporated entirely herein by reference. As set forth in these patents, high quality, semi-insulating silicon carbide substrates are technically desirable for electronic devices that operate in (or produce) microwave frequencies within the electromagnetic spectrum.

The term "microwaves" refers to electromagnetic energy in frequencies covering the range of about 0.1 gigahertz (GHz) to 1,000 GHz with corresponding wavelengths from about 300 centimeters to about 0.3 millimeters. Silicon carbide's very high electric breakdown field offers a primary advantage for microwave applications. This characteristic of silicon carbide enables devices such as metal semiconductor field effect transistors (MESFETs) to operate at drain voltages ten times higher than field effect transistors formed in gallium arsenide (GaAs).

Additionally, silicon carbide has the significant advantage of a thermal conductivity of 4.9 watts per degree Kelvin per centimeter (W/K-cm) which is 3.3 times higher than silicon and ten times higher than either gallium arsenide or sapphire. These properties give silicon carbide a high power density in terms of gate periphery measured in terms of watts per millimeter (W/mm) and also an extremely high power handling capability in terms of die area (W/mm$^2$). This is particularly advantageous for high power, high frequency applications because die size becomes limited by wavelength. Accordingly, because of the excellent thermal and electronic properties of silicon carbide, at any given frequency, silicon carbide MESFETs should be capable of at least five times the power of devices made from gallium arsenide.

As recognized by those familiar with microwave devices, they often require high resistivity ("semi-insulating") substrates because conductive substrates tend to cause significant undesirable coupling problems at microwave frequencies. As used herein, the terms "high resistivity" and "semi-insulating" can be considered synonymous for most purposes. In general, both terms describe a semiconductor material having a resistivity greater than about 1500 ohm-centimeters ($\Omega$-cm), including high-resistivity crystals that can be referred to as "fully insulating."

Typically, silicon carbide in its conventional form tends to be conductive. Thus, using silicon carbide as a resistive material requires some treatment of the material to obtain the resistive (semi-insulating) properties. In many cases, this treatment takes the form of adding states ("levels") within the bandgap that trap electrons or holes (or both) within the bandgap and thus preclude semiconductive behavior. Such states are typically created by adding dopant atoms (elements) to the semiconductor, but can also be created by forming (or taking advantage of) crystal defects such as lattice vacancies and mispositioned atoms or complexes of these.

Microwave devices are particularly important for monolithic microwave integrated circuits (MMICs) which are widely used in communications devices such as pagers and cellular phones, and which generally require a high resistivity substrate. Accordingly, the following characteristics are desirable for microwave device substrates: A a high crystalline quality suitable for highly complex, high performance circuit elements, good thermal conductivity, good electrical isolation between devices and to the substrate, low resistive loss characteristics, low cross-talk characteristics, and large wafer diameter.

Other devices similarly may require or can benefit from high resistivity substrates. These include high electron mobility transistors ("HEMTs"), of which those formed in other wide bandgap semiconductors such as the Group III nitrides (e.g. GaN, AlGaN, InGaN) are particularly attractive. Therefore, higher-quality high resistivity substrates offer similar advantages for GaN HEMTs and related devices.

Given silicon carbide's wide bandgap (3.2 eV in 4H silicon carbide at 300K), such semi-insulating characteristics are theoretically possible. As one result, an appropriate high resistivity silicon carbide substrate should permit both power and passive devices to be placed on the same integrated circuit ("chip") thus decreasing the size of the device while increasing its efficiency and performance. Silicon carbide also provides other favorable qualities, including the capacity to operate at high temperatures without physical, chemical, or electrical breakdown.

As those familiar with silicon carbide are aware, however, silicon carbide grown by most techniques is generally too conductive for these purposes. In particular, the nominal or unintentional nitrogen concentration in silicon carbide tends to be high enough in sublimation grown crystals (1–2×$10^{17}$cm$^{-3}$) to provide sufficient conductivity to prevent such silicon carbide from being used in microwave devices.

As noted above, semi-insulating, silicon carbide devices should have a substrate resistivity of at least 1500 ohm-centimeters ($\Omega$-cm) in order to achieve RF passive behavior. Furthermore, resistivities of 5000 $\Omega$-cm or better are needed to minimize device transmission line losses to an acceptable level of 0.1 dB/cm or less. For device isolation and to minimize backgating effects, the resistivity of semi-insulating silicon carbide should approach a range of 50,000 $\Omega$-cm or higher.

Certain work in this area suggests that satisfactory semi-insulating SiC can be produced by introducing deep level dopants (i.e. those creating states at least 300 meV from both the conduction and valence band edges) such as vanadium into the crystal; e.g. U.S. Pat. No. 5,611,955.

Additionally, the presence of non-elemental deep levels or intrinsic point defects (i.e., features that affect the electronic characteristics of the crystal, but that do not result from elements) can affect the electronic properties of the crystal, including favorably contributing to raising the resistivity of the silicon carbide crystal. Such deep levels can result from, among others, carbon vacancies, silicon vacancies, carbon atoms in silicon positions, and silicon in carbon positions.

As set forth in U.S. Pat. No. 6,218,680 and its offspring, however, introducing additional elements into the crystal can raise other disadvantages. Thus, U.S. Pat. No. 6,218,680 shows how semi-insulating silicon carbide can be produced without vanadium domination by incorporating shallow dopants and intrinsic point defects to produce the desired characteristics, while reducing the amount of nitrogen present. The '680 patent also provides a relevant discussion of the disadvantages of various other techniques for attempting to produce semi-insulating (high-resistivity) silicon carbide.

In silicon carbide that is made semi-insulating using the techniques of the '680 and related patents, the net p-type doping is produced by boron (B) and is very uniformly distributed in the crystal.

The distribution of nitrogen, however, is quite non-homogeneous. In the sublimation growth of SiC (usually in the form of a circular boule growing in the axial direction) this uneven distribution exhibits itself as radial and axial variations in the resistivity in the crystal. In turn, these variations result in a relatively low yield (i.e., percentage of resulting substrates that are satisfactory) of the desired material. Stated differently, controlling the boron to a desired concentration is relatively easy, but controlling the nitrogen concentration to specific levels is relatively difficult. Accordingly, minimizing the nitrogen concentration is one simple method of minimizing or avoiding its variation. Nevertheless, overly-low levels of nitrogen may fail to provide the desired amount of shallow n-type dopants required to compensate the boron and (along with other factors) help provide the semi-insulating characteristics.

SUMMARY OF INVENTION

Therefore, it is an object of the present invention to provide a semi-insulating silicon carbide substrate that offers the capabilities that are required and advantageous for high frequency operation, but while avoiding the disadvantages of prior materials and techniques.

The invention meets this object with a method of producing highly uniform semi-insulating characteristics in single crystal silicon carbide for semiconductor applications. The method comprises irradiating a silicon carbide single crystal having net p-type doping and deep levels with neutrons until the concentration of $^{31}P$ equals or exceeds the original net doping while remaining equal to or less than the sum of the concentration of deep levels and the concentration of the original net p-type doping.

In another aspect, the invention comprises irradiating a silicon carbide single crystal that has a nitrogen concentration of 5E16 cm$^{-3}$ or less and a concentration of deep level trapping elements of 1E16 cm$^{-3}$ or less and a known concentration of net p-type doping above 1E14 cm$^{-3}$ with neutrons until the concentration of $^{31}P$ exceeds the concentration of the net p-type dopants and the number of deep levels in the crystal exceeds the net difference between the concentration of the $^{31}P$ and the net p-type doping, and to thereby produce a compensated, semi-insulating silicon carbide crystal.

In another aspect, the invention comprises a semi-insulating silicon carbide single crystal comprising net p-type doping of between about 1E13 cm$^{-3}$ and 1E16 cm$^{-3}$, a concentration of deep levels greater than 1E12 cm$^{-3}$, a concentration of $^{31}P$ of between about 1E13 cm$^{-3}$ and 1E16 cm$^{-3}$, and a resistivity of at least about 5000 ohm-centimeters.

The foregoing and other objects and advantages of the invention and the manner in which the same are accomplished will become clearer based on the followed detailed description.

DETAILED DESCRIPTION

The invention is a method of producing highly uniform semi-insulating characteristics in single-crystal silicon carbide for high-frequency semiconductor devices and related applications. In one aspect, the invention is a method of producing highly uniform semi-insulating characteristics in single crystal silicon carbide for semiconductor applications by irradiating a silicon carbide single crystal having an original net p-type doping concentration and deep levels with neutrons until the concentration of $^{31}P$ equals or exceeds the original net p-type doping while remaining equal to or less than the sum of the concentration of deep levels and the concentration of original net p-type doping.

Stated as a formula, the resulting crystal has the following characteristics:

net $p < {}^{31}P <$ (net $p$+deep levels)

where net p is the number of uncompensated p-type dopants prior to irradiation (also referred to as "neutral p centers"). As is common and well understood in this art, the term "deep level" refers to states that are at least about 0.5 electron volts (eV) from a band edge, and preferably at least about 0.7 eV from the band edge.

In another aspect, the method compromises irradiating a silicon carbide crystal that has a nitrogen concentration of 5E16 per cubic centimeter (cm$^{-3}$) or less and a concentration of deep-level trapping elements of 1E16 cm$^{-3}$ or less and a net p-type doping above 1E14 cm$^{-3}$ with neutrons until the concentration of $^{31}P$ is greater than or equal to, and within an order of magnitude of, the concentration of the net p-type doping, and the number of deep level defects in the crystal exceeds the net difference between the concentration of the $^{31}P$ and the net p-type doping and to thereby produce a compensated silicon carbide crystal. In a preferred environment, the method comprises irradiating the silicon carbide crystal until the concentration of $^{31}P$ is substantially the same as the concentration of the net p-type doping.

As used herein, the "E" designation is an abbreviation for exponential notation. Thus, the designation "5E16" is the abbreviation for 5×10$^{16}$, and so forth. This form of abbreviation is well-understood and widely used in this art.

The step of irradiating the silicon carbide crystal can comprise irradiating a bulk single crystal of silicon carbide or irradiating an epitaxial layer of silicon carbide. Because the purpose of the invention is to provide semi-insulating silicon carbide for devices, the method also comprises forming a semiconductor device on a substrate formed from the bulk single crystal, or incorporating the epitaxial layer of the invention into a semiconductor device.

In the relevant nuclear reaction, $^{30}Si$ (which has a natural abundance of about 3.1%) captures a thermal neutron to become $^{31}Si$ with the emission of a gamma ($\gamma$) ray. The $^{31}Si$ then decays to $^{31}P$ with the emission of the beta ($\beta$) particle. The $^{31}Si$ has a relatively short half-life of about 2.5 hours, and thus the $^{31}Si$ will decay into phosphorus 31 within a reasonable period of time. In common notation, these reactions can be expressed as:

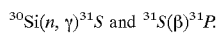
$^{30}Si(n, \gamma)^{31}S$ and $^{31}S(\beta)^{31}P$.

The overall process is generically referred to as "neutron transmutation doping"("NTD").

In a preferred embodiment, the silicon carbide crystal is doped with boron (B) as the p-type dopant. The boron concentration is preferably between about 1E13 and 1E16 cm$^{-3}$ with concentrations of about 5E15 cm$^{31\ 3}$ being most preferred, and with the concentration of resulting $^{31}P$ being within an order of magnitude of the concentration of boron; i.e., between about 5E14 cm$^{-3}$ and 5E16 cm$^{-3}$. In circumstances where it is desirable to have the crystal highly, but not completely compensated, the irradiation step can comprise irradiating the silicon carbide crystal doped with boron until the concentration of $^{31}$P approaches, but does not equal the concentration of boron. In such an embodiment where boron is present at about 5E15 cm$^{-3}$, the concentration of $^{31}$P should be 4E15 cm$^{-3}$.

In certain preferred embodiments, the method further comprises annealing the silicon carbide crystal following the irradiation for a time and at a temperature sufficient to heal a number of radiation-induced defects to preclude the radiation-induced defects from substantially affecting the electronic characteristics of the crystal and to thus permit the intrinsic defects in the crystal to substantially establish the semi-insulating characteristics of the crystal.

Alternatively, if the number of defects desired or required is greater than the number of intrinsic defects, the method can comprise annealing the silicon carbide crystal for a time and at a temperature sufficient to reduce the amount of radiation-induced defects, but not totally eliminate them, to a desired amount that participate in establishing the electronic characteristics of the crystal.

The annealing step is preferably carried out at temperatures of between about 800° and 1850° Centigrade (C) for a period of between about 15 and 60 minutes, with temperatures of between about 1600° and 1700° C. being preferred for an anneal period of about 30 minutes.

As a third possibility, the annealing step can be omitted so that the radiation-induced defects will predominate and set and establish the electronic characteristics of the crystal.

Although the invention is useful with any single-crystal polytype of silicon carbide, in preferred embodiments the silicon carbide has a polytype selected from the group consisting of the 6H and 4H polytypes.

As set forth in the background portion of the specification and in the incorporated references, one of the advantages of the invention is its creation of semi-insulating silicon carbide in the absence of deep-level trapping elements such as vanadium, and thus the method preferably comprises irradiating a silicon carbide crystal that has a vanadium concentration of about 1E16 cm$^{-3}$ or less.

In the method of the invention, the irradiation is preferably carried out with a combination of fast and thermal neutrons. The difference between thermal and fast neutrons is well understood in this and other arts, and will not be repeated herein in detail. Some analogous irradiation steps are described in an exemplary, but not limiting, manner in Heissenstein, *Characterization of Phosphorous Doped n-type 6H-Silicon Carbide Epitaxial Layers Produced by Nuclear Transmutation Doping,* J. Appl. Physics 83(12), p. 7542 (1998), and Heissenstein, *Radiation Defects and Doping of SiC with Phosphorous by Nuclear Transmutation Doping (NTD),* Materials Science Forum Vol. 338–342, p. 853 (2000).

When the crystal is irradiated, the thermal neutrons carry out the NTD conversion of $^{30}$Si to $^{31}$Si followed by the beta decay to $^{31}$P, while the fast neutrons tend to damage the crystal. As set forth elsewhere herein, some or all of the damage can create point defects and deep levels that favorably contribute to the resistivity of the crystal.

In currently preferred embodiments of the invention, the irradiation is carried out with a ratio of fast:thermal neutrons of about 10:1.

Furthermore, the general steps of NTD are commercially well-understood and available. By way of example and comparison (and not limitation), NTD-doped silicon is commercially available from Valley Design Corp. of Westford Mass. (USA) or from the HIFAR reactor of the Australian Institute of Nuclear Science and Engineering ("AINSE", New South Wales 2234 Australia) and the Australian Nuclear Science and Technology Organization ("ANSTO").

In a typical embodiment, the crystal is irradiated with neutrons with a fluence (or "flux") of between about 1E17 and 1E21 per square centimeter (cm$^{-2}$) and an average neutron energy of 25 meV. If fast neutrons are generated by a reactor, they can be moderated to produce the thermal neutrons that irradiate the crystal. The nature, theory and use of moderators to generate thermal neutrons from fast neutrons is generally well understood in the art, and can be understood from the incorporated references and other information widely available in the art. Thus, those of ordinary skill in the art can carry out this aspect of the invention without undue experimentation.

In another aspect, the invention includes the method of producing highly uniform semi-insulating characteristics in single crystal silicon carbide that further includes the steps of forming the silicon carbide crystal with a nitrogen concentration of $5 \times 10^{16}$ cm$^{-3}$(5E16) or less and a concentration of deep level trapping elements of 1E16 cm$^{-3}$ or less and while including a predetermined concentration of p-type dopant in the silicon carbide crystal, both prior to the step of irradiating the silicon carbide crystal with neutrons. In the most typical preferred embodiments, the step of forming the crystal comprises forming a bulk silicon carbide crystal by seeded sublimation growth or forming an epitaxial layer by chemical vapor deposition. The seeded sublimation growth of silicon carbide is best set forth in U.S. Pat. No. 4,866,005, or its reissue No. RE34,861. An exemplary method of epitaxial growth of silicon carbide is set forth in U.S. Pat. No. 4,912,064. The growth of the single crystal can also include the higher temperature means of growth that incorporates some of the aspects of chemical vapor deposition and some of sublimation as set forth in commonly assigned U.S. Pat. Nos. 6,297,522 and 6,063,186. The contents of all of these patents are incorporated entirely herein by reference.

In yet another aspect, the invention is a semi-insulating silicon carbide crystal suitable for high-frequency semiconductor devices and applications. In this aspect, the crystal includes a net p-type doping of between about 1E13 and 1E16 cm$^{-3}$, a concentration of deep levels greater than 1E12 cm$^{-3}$, a concentration of $^{31}$P between about 1E13 and 1E16 cm$^{-3}$, and a resistivity of at least about 5000 ohm-centimeters.

In another aspect, the crystal comprises a concentration of $^{31}$P of between about 1E13 and 1E16 cm$^{-3}$, a concentration of p-type dopant of between about 1E13 and 1E16 cm$^{-3}$, and that is also within an order of magnitude of the concentration of $^{31}$P, a concentration of nitrogen of less than 5E16 cm$^{-3}$, a concentration of deep level trapping elements (particularly vanadium) of less than 1E16 cm$^{-3}$, and a resistivity of at least about 5,000 ohm-centimeters ($\Omega$-cm). The semi-insulating silicon carbide crystal can be either a bulk single crystal or an epitaxial layer. In preferred embodiments, the p-type dopant comprises boron and in the most preferred embodiments the crystal has a concentration of boron of about 5E15 cm$^{-3}$. The preferred resistively will generally be at least about 10,000 $\Omega$-cm and most preferably is at least about 50,000 $\Omega$-cm.

With the concentration of deep level trapping elements such as vanadium maintained at less than 1E16 cm$^{-3}$, the crystal obtains its semi-insulating characteristics from defects in the crystal, either from intrinsic defects or those generated by the neutron irradiation. Following an anneal that heals the crystal and reduces the concentration of radiation induced defects, a preferred embodiment will have a concentration of intrinsic defects that is greater than the net difference between the concentration of the $^{31}$P and the concentration of the net p-type doping. More preferably, the concentration of deep levels should greatly exceed the net difference between the concentration of $^{31}$P and the net p-type doping.

The semi-insulating substrate is useful as a substrate or an epitaxial layer in a variety of devices based partially or entirely on silicon carbide. Accordingly, the invention includes semiconductor devices that incorporate the semi-insulating silicon carbide crystal according to the invention. In particular, such devices include those such as metal-semiconductor field effect transistors (MESFETs), metal-insulator field effect transistors (MISFETs), and high electron mobility transistors (HEMTs). The nature, structure and operation of such devices are generally well understood in the art and need not be elaborated upon here.

Furthermore, because the fluence and energy of the thermal neutrons can be precisely controlled, the process of the invention creates very uniform and precise levels of resulting phosphorus formation in the material.

In summary, the invention provides three scenarios for obtaining the desired semi-insulating or high-resistivity characteristics of the material. First, very uniform concentration of the background boron in the material can be achieved which allows the thermally induced intrinsic deep levels to dominate the conductivity and produce semi-insulating silicon carbide material. In this scenario, the irradiated wafers are usually annealed to eliminate radiation-induced defects.

As a second possibility, the irradiation-induced defects can be allowed to remain (i.e., annealing is omitted) and they tend to dominate the semi-insulating behavior instead of the intrinsic defects.

As described in certain of the previously incorporated references, in current technology, nitrogen doping is used to compensate the p-type net doping of the crystal to thus allow the thermally-induced deep level intrinsic point defects to dominate the electrical characteristics of the material. The net p-type doping is from boron and is very uniformly distributed in the crystal. Nevertheless, the distribution of nitrogen doping during silicon carbide growth is very inhomogeneous (FIG. 1) and therefore produces radial and axial resistivity inhomogeneities in the crystal which result in a low yield for the production of semi-insulating silicon carbide wafers.

The method of the invention, however, produces a very uniform phosphorous distribution in the crystal because of the very uniform silicon distribution in the host silicon carbide. Additionally, NTD allows very precise adjustment of the phosphorous to the net p-type doping (B) level by controlling the neutron dose in the nuclear reactor. The invention thus permits very high yield production of semi-insulating silicon carbide wafers.

In the specification there has been set forth a preferred embodiment of the invention, and although specific terms have been employed, they are used in a generic and descriptive sense only and not for purposes of limitation, the scope of the invention being defined in the claims.

What is claimed is:

1. A method of producing highly uniform semi-insulating characteristics in single crystal silicon carbide for semiconductor applications, the method comprising:

irradiating with neutrons a boron-doped silicon carbide single crystal having net p-type doping and a concentration of deep levels until the concentration of $^{31}$P in the irradiated crystal equals or exceeds the original net p-type doping in the crystal while remaining after irradiation equal to or less than the sum of the concentration of deep levels and the original net p-type doping in the crystal;

wherein the irradiating step is carried out with a combination of fast and thermal neutrons.

2. A method according to claim 1 comprising irradiating the silicon carbide single crystal having net p-type doping and deep levels with neutrons until the concentration of $^{31}$P equals or exceeds the original net p-type doping but is less than the sum of the concentration of deep levels and the concentration of the original net p-type doping.

3. A method according to claim 1 comprising irradiating the silicon carbide single crystal having net p-type doping and deep levels with neutrons until the concentration of $^{31}$P exceeds the original net p-type doping while remaining equal to or less than the sum of the concentration of deep levels and the concentration of the original net p-type doping.

4. A method according to claim 1 comprising irradiating the silicon carbide single crystal having net p-type doping and deep levels with neutrons until the concentration of $^{31}$P exceeds the original net p-type doping and is less than the sum of the concentration of deep levels and the concentration of the original net p-type doping.

5. A method according to claim 1 and further comprising annealing the silicon carbide crystal following the irradiation for a time and at a temperature sufficient to heal a number of the radiation induced defects sufficient to preclude the radiation induced defects from substantially affecting the electronic characteristics of the crystal and to thus permit the non-radiation induced intrinsic deep levels in the crystal to substantially establish the semi-insulating characteristics of the crystal.

6. A method according to claim 1 and further comprising annealing the silicon carbide crystal for a time and at a temperature sufficient to reduce the amount of radiation-induced defects to a desired amount that participate in establishing the electronic characteristics of the crystal.

7. A method according to claim 1 comprising irradiating the silicon carbide crystal until the concentration of $^{31}$P is substantially the same as the concentration of the net p-type doping.

8. A method according to claim 1 comprising irradiating the silicon carbide crystal that has an elemental deep level concentration of 1E16 cm$^{-3}$ or less.

9. A method according to claim 1 comprising irradiating the silicon carbide crystal that has a vanadium concentration of 1E14 cm$^{-3}$ or less.

10. A method of producing highly uniform semi-insulating characteristics in single crystal silicon carbide for high frequency semiconductor devices and related applications, the method comprising:

irradiating a silicon carbide crystal with neutrons; the silicon carbide crystal having a nitrogen concentration of 5E16 cm$^{-3}$ or less and a concentration of deep level trapping elements of 1E16 cm$^{-3}$ or less and a known concentration of net p-type doping above 1E14 cm$^{-3}$, the irradiation continuing until the concentration of 31P exceeds the concentration of the net p-type doping, and the number of deep levels in the crystal exceeds the net difference between the concentration of the $^{31}$P and the concentration of the net p-type doping; and thereby produce a compensated, semi-insulating silicon carbide crystal, wherein the p-type dopant is boron; and wherein the irradiating step is carried out with a combination of fast and thermal neutrons.

11. A method according to claim 10 and further comprising annealing the silicon carbide crystal following the irradiation for a time and at a temperature sufficient to heal a number of the radiation induced defects sufficient to preclude the radiation induced defects from substantially affecting the electronic characteristics of the crystal and to thus permit the non-radiation induced intrinsic deep levels in the crystal to substantially establish the semi-insulating characteristics of the crystal.

12. A method according to claim 10 and further comprising annealing the silicon carbide crystal for a time and at a temperature sufficient to reduce the amount of radiation-induced defects to a desired amount that participate in establishing the electronic characteristics of the crystal.

13. A method according to claim 11 or claim 12 comprising annealing the silicon carbide crystal at a temperature of between about 800° C. and 2400° C. for a period of between about 15 and 60 minutes.

14. A method according to claim 10 comprising irradiating the silicon carbide crystal in which the net p-type doping is $1 \times 10^{15}$ cm$^{-3}$.

15. A method according to claim 10 comprising irradiating the silicon carbide crystal in which the concentration of uncompensated boron is $1 \times 10^{15}$ cm$^{-3}$.

16. A method according to claim 10 comprising irradiating the silicon carbide crystal in which the concentration of uncompensated boron is $1 \times 10^{15}$ cm$^{-3}$.

17. A method according to claim 10 comprising irradiating the silicon carbide crystal in which the concentration of uncompensated boron is $1 \times 10^{15}$ cm$^{-3}$ until the concentration of $^{31}$P is about $2 \times 10^{15}$ cm$^{-3}$.

18. A method according to claim 10 comprising irradiating the silicon carbide crystal having a polytype selected from the group consisting of the 6H, 4H, and 15R polytypes.

19. A method according to claim 10 comprising irradiating the silicon carbide crystal having a boron concentration of between about $1 \times 10^{13}$ and $1 \times 10^{16}$ cm$^{-3}$.

20. A method according to claim 19 comprising annealing the crystal at a temperature of between about 1600° C. and 1700° C. for about 30 minutes.

21. A method according to claim 10 comprising irradiating the silicon carbide crystal having a concentration of deep levels of 1E12 cm$^{-3}$ or greater.

22. A method according to claim 10 comprising irradiating a bulk single crystal of silicon carbide.

23. A method according to claim 10 comprising irradiating a silicon carbide wafer.

24. A method according to claim 23 further comprising forming a semiconductor device on the wafer.

25. A method according to claim 10 comprising irradiating an epitaxial layer of silicon carbide.

26. A method according to claim 25 further comprising incorporating the epitaxial layer into a semiconductor device.

27. A method according to claim 10 comprising irradiating the silicon carbide crystal with a fluence of between about 1 and $50 \times 10^{19}$ cm$^{-2}$ at an average neutron energy of 25 meV.

28. A method according to claim 10 comprising moderating fast neutrons to produce thermal neutrons to irradiate the silicon carbide crystal.

29. A method of producing highly uniform semi-insulating characteristics in single crystal silicon carbide according to claim 8 and further comprising:

forming a silicon carbide crystal and including a predetermined concentration of net p-type doping in the silicon carbide crystal, both prior to the step of irradiating the silicon carbide crystal with neutrons.

30. A method according to claim 29 wherein the step of forming the silicon carbide crystal comprises forming a bulk silicon carbide crystal by seeded sublimation growth.

31. A method according to claim 29 wherein the step of forming the silicon carbide crystal comprises forming a silicon carbide epitaxial layer by chemical vapor deposition.

* * * * *